United States Patent [19]
Shoki et al.

[11] Patent Number: 5,999,590
[45] Date of Patent: *Dec. 7, 1999

[54] X-RAY MASK BLANK AND MANUFACTURING METHOD FOR THE SAME, AND MANUFACTURING METHOD FOR X-RAY MASK

[75] Inventors: Tsutomu Shoki, Hachioji; Takamitsu Kawahara, Kawasaki, both of Japan

[73] Assignee: Hoya Corporation, Tokyo, Japan

[*] Notice: This patent is subject to a terminal disclaimer.

[21] Appl. No.: 08/990,041

[22] Filed: Dec. 12, 1997

[30] Foreign Application Priority Data

Dec. 14, 1996 [JP] Japan ................................. 8-352703
Mar. 27, 1997 [JP] Japan ................................. 9-093147

[51] Int. Cl.⁶ ....................................................... G03F 1/16
[52] U.S. Cl. ..................................... 378/35; 378/34; 430/5
[58] Field of Search .......................... 378/34, 35; 430/5

[56] References Cited

U.S. PATENT DOCUMENTS

| | | | |
|---|---|---|---|
| 4,530,891 | 7/1985 | Nagarekawa et al. | 430/5 |
| 4,720,442 | 1/1988 | Shinkai et al. | 430/5 |
| 5,756,237 | 5/1998 | Amemiya | 430/5 |
| 5,848,120 | 12/1998 | Shoki et al. | 378/35 |

FOREIGN PATENT DOCUMENTS 2-192116  7/1990  Japan .

Primary Examiner—David P. Porta
Attorney, Agent, or Firm—Perman & Green, LLP

[57] ABSTRACT

An X-ray mask blank and a manufacturing method for an X-ray mask make it possible to manufacture an X-ray mask which has an extremely low stress, thus providing an extremely high positional accuracy. In the X-ray mask blank, an X-ray transparent film is formed on a substrate, and an X-ray absorber film is formed on the X-ray transparent film. An etching mask layer composed of a material containing chromium and carbon, and/or nitrogen is provided on the X-ray absorber film.

10 Claims, 4 Drawing Sheets

X-RAY MASK BLANK AND MANUFACTURING METHOD FOR THE SAME, AND MANUFACTURING METHOD FOR X-RAY MASK

REFERENCE TO RELATED APPLICATION

This application claims the priority right under 35 U.S.C. 119 of Japanese Patent Application No. Hei 08-352703 filed on Dec. 14, 1996 and Hei 09-93147 filed on Mar. 27, 1997, the entire disclosure of which is incorporated herein by reference.

BACKGROUND OF THE INVENTION

1. Field of the Invention

The present invention relates to an X-ray mask blank and a manufacturing method for the same and a manufacturing method for an X-ray mask used for X-ray lithography.

2. Description of the Related Art

In the semiconductor industry, as a technique for transferring a fine pattern to form an integrated circuit composed of a fine pattern on a silicon substrate or the like, a photolithography method has been hitherto used in which the fine pattern is transferred using visible light or ultraviolet light as the electromagnetic wave for exposure.

In recent years, however, with the advances of the semiconductor technology, the integration scale of super-LSIs or other semiconductor devices is growing larger. This has led to a demand for a higher-precision fine pattern transfer technique which breaks through the limitations of the transfer technique that depends on visible light or ultraviolet light conventionally used in the photolithography method.

To implement the transfer of such a fine pattern, an X-ray lithography method using X-rays shorter in wavelength than visible light or ultraviolet light is being developed and put in practical use.

The configuration of an X-ray mask employed for the X-ray lithography is shown in FIG. 1.

As shown in the drawing, an X-ray mask 1 is constituted by an X-ray transparent film or membrane 12, through which X-rays are transmitted, and an X-ray absorber pattern 13a for absorbing X-rays; these components are supported by a support substrate or frame 11a made of silicon.

FIG. 2 shows the configuration of an X-ray mask blank. An X-ray mask blank 2 is composed of the X-ray transparent film 12 and an X-ray absorber film 13 formed on a silicon substrate 11.

For the X-ray transparent film, silicon carbide having high Young's modulus and exhibiting high resistance to the exposure to X-rays is commonly used. For the X-ray absorber film, an amorphous material containing Ta which is highly resistant to the exposure of X-rays is frequently used.

The X-ray mask 1 is fabricated from the X-ray mask blank 2 by, for example, the following process.

A resist film on which a desired pattern has been formed is placed on the X-ray mask blank 2, then dry etching is performed using the resist pattern as the mask to form an X-ray absorber film pattern. After that, the film of the area which corresponds to a window area (the recessed portion on the back surface) of an X-ray transparent film formed on the back surface is removed by a reactive ion etching (RIE) process which employs $CF_4$ as the etching gas. The remaining film is used as the mask to etch the back surface of the silicon substrate by using an etchant composed of a mixture of hydrofluoric acid and nitric acid so as to obtain the X-ray mask 1.

In the process mentioned above, an electron beam (EB) resist is usually used as the resist; the pattern is formed by exposure using an EB writing process.

The EB resist, however, does not have sufficiently high resistance to dry etching, which is quick etching, used for processing the X-ray absorber film. Hence, if the X-ray absorber film is directly etched using the resist pattern as the mask, then the resist pattern is lost by etching before the formation of the pattern on the X-ray absorber film is completed, making it impossible to obtain the desired X-ray absorber pattern.

As a general solution to the foregoing problem, a film known as an etching mask layer having a high etching selective ratio relative to the X-ray absorber film is inserted between the X-ray absorber film and the resist in order to form the X-ray absorber film pattern.

In such a case, to prevent a difference in size from being produced between the resist pattern and the X-ray absorber pattern, which difference is referred to as "pattern conversion difference," it is necessary to make the etching mask layer as thin as possible. For this reason, when patterning the X-ray absorber film, it is required to set the speed for etching the etching mask layer sufficiently low (a high etching selective ratio) in relation to the speed for etching the X-ray absorber film.

In addition, the X-ray absorber film must be etched for a slightly longer than the time actually required for etching the X-ray absorber film, which is known as "over-etching," so as to ensure a uniform pattern configuration on a wafer surface without leaving any unetched portions on the mask surface.

The over-etching causes the X-ray transparent film, which is located under the X-ray absorber film, to be exposed to plasma. If the layer under the X-ray absorber film is, for example, an X-ray transparent film composed of a silicon carbide, then the etching speed for the X-ray transparent film exceeds a negligible speed in relation to the etching conditions of the X-ray absorber film. Hence, the X-ray transparent film is over-etched, leading to a thinner layer thereunder, namely, the X-ray transparent film, and a deteriorated pattern configuration of the X-ray absorber film itself. The thinner X-ray transparent film undesirably causes a change in the optical transmittance required for the alignment at the time of setting on an X-ray aligner, or adds to the positional distortion of the mask.

Therefore, it is preferable to insert an etching stopper layer between the X-ray absorber film and the X-ray transparent film, the etching stopper layer being made of a material which is resistant to etching (which has a high etching selective ratio) when etching the X-ray absorber film.

Hitherto, chlorine gas has been used for etching an X-ray absorber film containing Ta as a chief ingredient thereof, while a Cr film has been used as the etching mask layer and the etching stopper layer that enable a high etching selective ratio for the X-ray absorber film. A fluoride gas such as $SF_6$ has been used for etching the X-ray absorber film which has W as the chief ingredient thereof, and the Cr films have been used for the etching mask layer and the etching stopper layer for the X-ray absorber film. These Cr films are formed on the bottom and/or the top of the X-ray absorber film by the sputtering method in most cases.

High positional accuracy is required of the X-ray mask; for instance, the distortion of the X-ray mask for a 1-Gbit DRAM which has a 0.18 μm design rule pattern must be controlled to 22 nm or less.

The positional distortion is heavily dependent on the stress of the material of the X-ray mask; if the stress of the X-ray absorber film, the etching mask layer, or the etching stopper layer is high, then the positional distortion is provoked. Hence, the stress of the X-ray absorber film, the etching mask layer, and the etching stopper layer must be minimized.

No satisfactory study, however, has been performed on the stress, the perpendicularity of pattern sidewalls, or the sharpness of patterns of the X-ray masks for the DRAMs of 1 Gbits or more.

SUMMARY OF THE INVENTION

Accordingly, it is an object of the present invention to provide mainly an X-ray mask blank which permits the manufacture of an X-ray mask having an extremely low stress and hence exhibiting an extremely high positional accuracy while maintaining a high etching selective ratio, and to provide a manufacturing method for the same.

It is another object of the present invention to mainly provide an X-ray mask blank which permits the manufacture of an X-ray mask providing an X-ray absorber film pattern which has a perpendicular sidewall and which is sharp, and to provide a manufacturing method for the same.

The inventors have devoted themselves to the study for fulfilling the objects mentioned above, and have found out that a Cr film, which has been predominantly employed in the past, is advantageous in that it has a high etching selective ratio (the X-ray absorber film relative to the Cr film) of ten or more in relation to the X-ray absorber film. It has been found, however, that the Cr film, which is a crystalline film, is scarcely dependent upon the film preparing condition in the sputtering process, and exhibits a high tensile stress of 500 MPa or more. The inventors have verified that using the Cr film having such a high stress for the etching mask layer or the etching stopper layer fails to satisfy the required positional accuracy of the mask due to the positional distortion caused by the stress, making it difficult to manufacture the X-ray masks for the DRAMs of 1 Gbits or more.

Further study including simulation analyses carried out by the inventors has revealed that the stress of the X-ray absorber film with 0.5 $\mu$m in thickness must be 10 MPa or less, and the stress of the etching mask layer and the etching stopper layer with 0.05 $\mu$m must be 100 MPa or less. The inventors have also discovered that a material containing chromium and carbon, and/or nitrogen is suitably used as the film material for the etching mask layer and the etching stopper layer because it provides a high etching selective ratio and extremely low film stress at the same time; the inventors therefore concluded that such a material is indispensable for manufacturing the X-ray masks for DRAMs of 1 Gbits more. The inventors have further discovered that the use of the etching mask layer and the etching stopper layer composed of such a material in manufacturing X-ray masks makes it possible to produce X-ray masks providing X-ray absorber film patterns which have perpendicular sidewalls and which are sharper. According to further finding by the inventors, it is not sufficient to merely use the material containing the chromium and carbon, and/or nitrogen for producing the etching mask layer and the etching stopper layer to obtain the advantages mentioned above; it is necessary to optimize the film thickness and the film composition of the etching mask layer and the etching stopper layer. Based on the findings, the present invention has been completed.

According to one aspect of the present invention, there is provided an X-ray mask blank having an X-ray transparent film, through which X-rays are transmitted, on a substrate, and an X-ray absorber film, which absorbs X-rays, on the X-ray transparent film, wherein an etching mask layer made of a material containing chromium and carbon, and/or nitrogen is provided on the X-ray absorber film.

According to yet another aspect of the present invention, there is provided an X-ray mask blank having an X-ray transparent film, through which X-rays are transmitted, on a substrate, and an X-ray absorber film, which absorbs X-rays, on the X-ray transparent film, wherein an etching mask layer, which is made of a film containing chromium as a chief ingredient thereof and is provided on the X-ray absorber film.

The X-ray mask blank according to the invention described above is configured such that:
  the surface roughness of the etching mask layer is 1.0 nm or less;
  the X-ray transparent film is composed of silicon carbide;
  the X-ray absorber film is composed of a material made primarily of Ta;
  the X-ray absorber film is composed of a material which is made primarily of Ta and which contains at least B;
  the X-ray absorber film is a film having an amorphous structure which contains Ta as a chief ingredient thereof; or
  an etching stopper layer composed of a material containing chromium and carbon, and/or nitrogen is provided beneath the X-ray absorber film.

According to a further aspect of the present invention, there is provided a manufacturing method for an X-ray mask blank, which method having the steps of: forming an X-ray transparent film on a mask substrate; forming an X-ray absorber film on the X-ray transparent film; and forming an etching mask layer, which is composed of a material containing chromium and carbon, and/or nitrogen, on the X-ray absorber film; wherein the etching mask layer is formed by using a chromium target and by adding a gas containing carbon and/or a gas containing nitrogen to a sputtering gas in the step for forming the etching mask layer.

Further, the manufacturing method for an X-ray mask in accordance with the present invention is configured so as to manufacture an X-ray mask by employing the X-ray mask blank in accordance with the invention described above.

According to the invention, the use of the material containing chromium and carbon, and/or nitrogen for the etching mask layer and the etching stopper layer makes it possible to achieve an extremely low stress of 100 MPa or less while maintaining a high etching selective ratio, thus enabling an X-ray mask to be produced which minimizes positional distortion attributable to film stress and which provides extremely high positional accuracy.

Moreover, the use of the etching mask layer and the etching stopper layer composed of the material mentioned above makes it possible to manufacture X-ray masks with X-ray absorber film patterns which have perpendicular sidewalls and which are sharper.

In addition, an X-ray mask which has extremely high pattern accuracy and also extremely high positional accuracy can be obtained by optimizing the film thickness and the film composition of mainly the etching mask layer and the etching stopper layer in a relatively limited range.

The invention is ideally applied for the mass production of the X-ray masks for DRAMs of 1 Gbits or more; it is also suited for the manufacture of X-ray masks of DRAMs of 4 Gbits or more (a design rule of 0.13 $\mu$m line and space or less).

The present invention will now be explained in more detail.

First, the X-ray mask blank in accordance with the present invention will be explained.

The X-ray mask blank in accordance with the present invention has an X-ray transparent film on a substrate, and an X-ray absorber film on the X-ray transparent film.

As the substrate, a silicon substrate, namely, a silicon wafer, is frequently used; however, it is not limited thereto. A well-known substrate such as a quartz glass substrate may be employed instead.

As the X-ray transparent film, a SiC, SiN, or diamond thin film may be used. From the standpoint primarily of the resistance to the exposure to X-rays, the SiC thin film or the like is preferable.

Preferably, the film stress of the X-ray transparent film ranges from 50 to 400 MPa or less. Also preferably, the thickness of the X-ray transparent film ranges from about 1 $\mu$m to about 3 $\mu$m.

For the X-ray absorber film, a material which contains tantalum, tungsten, or other metal having a high melting point as the chief ingredient thereof may be used. To be more specific, such a material may be a compound of Ta and B such as $Ta_4B$ (Ta:B=8:2) or a tantalum boride having a composition other than $Ta_4B$, metal Ta, an amorphous material containing Ta, a Ta-based material containing Ta and other ingredient, metal W, a W-based material containing W and other ingredient, etc. From the standpoint mainly of the resistance to the exposure to X-rays, a material composed mainly of tantalum is preferable.

The X-ray absorber material composed mainly of tantalum preferably contains at least B also. This is because an X-ray absorber film containing Ta and B provides such advantages as a lower internal stress, a high purity, and a high rate of X-ray absorption; and moreover, it permits easier control of the internal stress by controlling the gas pressure when forming the film by sputtering.

The proportion of B in the X-ray absorber film which contains Ta and B is preferably 15 to 25 atomic percent. If the proportion of B in the X-ray absorber film exceeds the foregoing range, then the particle diameter of the microcrystal is too large, making the submicron-order microprocessing difficult. The inventors have already filed the application on the proportion of B in the X-ray absorber film under Japanese Unexamined Patent Publication No. Hei 2-192116.

The X-ray absorber material containing tantalum as the chief ingredient thereof preferably has an amorphous structure or a microcrystal structure. This is because a crystal structure or a metal structure would make it difficult to perform submicron-order microprocessing, and would generate a high internal stress, causing the X-ray mask to be distorted.

The film stress of the X-ray absorber film is preferably 10 MPa or less, and the thickness of the X-ray absorber film is preferably about 0.3 $\mu$m to about 0.8 $\mu$m.

The X-ray mask blank according to the present invention is characterized in that the etching mask layer composed of a material containing chromium and carbon, and/or nitrogen is provided on the X-ray absorber film.

The etching mask layer composed of a material containing chromium and carbon, and/or nitrogen is capable of providing an extremely low film stress while maintaining a high etching selective ratio. In this case, the etching selective ratio and the film stress can be controlled by adjusting and selecting the film composition, the total pressure of a sputtering gas, the RF power, the type of sputtering equipment, etc. In particular, the delicate control of the film stress can be accomplished by making fine adjustment mainly of the mixing ratio of the sputtering gas; an example is shown in FIG. 3. It can be seen from FIG. 3 that the delicate control of the film stress is possible by making fine adjustment of the mixing ratio of the sputtering gas in a limited range.

A film composed of chromium alone has a columnar structure or a crystalline structure. Adding carbon and/or nitrogen to chromium makes it possible to form a film having an amorphous structure or a microcrystal structure, or a film having these two structures. This enables the surface roughness of the etching mask layer to be reduced, that is, the surface can be made smoother, providing an advantage in that the edge roughness of the etching mask pattern can be reduced. In this case, the surface roughness Ra of the etching mask layer is preferably 1.0 nm or less, and more preferably 0.8 nm or less, and further preferably 0.6 nm or less.

Adding carbon and/or nitrogen to chromium provides high chemical resistance to sulfuric acid, hydrogen peroxide etc. frequently used as a cleaning solution.

A desirable film composition containing chromium and nitrogen and/or carbon depends on desired film characteristics including film stress, etching selective ratio, and acid resistance. It is generally preferable, however, that the contents of the elements are within the following ranges: when the film contains chromium and nitrogen, the content of nitrogen in the film should be 1 against about 2 to about 15 in atomic percent (N:Cr=1:about 2 to about 15); when the film contains chromium and carbon, the content of carbon in the film should be 1 against about 1.5 to about 15 in atomic percent (C:Cr=1:about 1.5 to about 15); or when the film contains chromium, nitrogen, and carbon, the contents of nitrogen and carbon in the film should be respectively as follows: Cr:N:C=about 55 to 66 atomic percent:about 1 to 33 atomic percent:about 1 to 40 atomic percent.

In the case of the etching mask layer composed of a material containing chromium and carbon, and/or nitrogen, primarily the resistance to heat and cleaning can be improved by using a ternary-based material containing chromium, carbon, and nitrogen or by adding oxygen, fluorine, or other element to an extent that does not affect the etching selective ratio or the film stress.

In the invention, an etching stopper layer composed of a material containing chromium and carbon, and/or nitrogen may be provided beneath the X-ray absorber film.

The configuration and operation of the etching stopper layer are the same as those of the etching mask layer; hence, the explanation thereof will be omitted. Combining the two makes it possible to manufacture an X-ray mask which has less positional distortion attributable to film stress, and extremely high positional accuracy and which also provides an X-ray absorber film pattern which has a vertical sidewall and which is sharper as compared with a case where only one of the two is employed.

The film thickness of the etching mask layer ranges from 10 to 200 nm, preferably from 15 to 60 nm, and further preferably from 30 to 50 nm.

Making the etching mask layer thin enables an etching mask pattern having a vertical sidewall to be obtained and also permits the influences of micro-loading effect to be reduced. This makes it possible to reduce the pattern conversion difference produced when dry-etching the X-ray absorber material layer by using the etching mask pattern as the mask.

The thickness of the etching stopper ranges from 5 to 100 nm, preferably from 7 to 50 nm, and more preferably from 10 to 30 nm.

A thinner etching stopper layer permits a shorter etching time, thus reducing the deformation of the X-ray absorber pattern caused by etching when removing the etching stopper layer.

It is preferable that the product of the film stress and the film thickness of the etching mask layer and the etching stopper layer is $\pm 1 \times 10^4$ dyn/cm or less.

If the product of the film stress and the film thickness exceeds the foregoing range, the positional distortion due to stress will be increased, making it impossible to obtain an X-ray mask having extremely high positional accuracy.

The manufacturing method for the X-ray mask blank in accordance with the present invention will now be explained.

The manufacturing method for the X-ray mask blank according to the invention is characterized in that the etching mask layer and/or the etching stopper layer is formed by employing a chromium target and by adding a gas containing carbon and/or a gas containing nitrogen to a sputtering gas.

The sputtering process may include, for instance, RF magnetron sputtering, DC sputtering, and DC magnetron sputtering.

As the gas containing carbon, there are, for example, hydrocarbon-based gases including methane, ethane, and propane.

As the gas containing nitrogen, there are, for example, nitrogen, ammonia gas, nitrogen monoxide, nitrogen dioxide, and dinitrogen monoxide.

As the sputter gas, there are, for example, inert gases including argon, xenon, krypton, and helium.

The amount of the gas containing carbon and/or the gas containing nitrogen to be added to the sputtering gas is adjusted so as to obtain the desired film composition, type of film (amorphous structure or microcrystal structure) and film characteristics including film stress, etching selective ratio, and acid resistance.

The desirable amount of a gas to be added depends on the type of the gas or other film forming conditions, the desired film characteristics, etc. However, it is generally preferable, for example, that when producing a film containing chromium and nitrogen by adding nitrogen to the sputtering gas, for example, the preferable amount of nitrogen to be added is 7% to 50%, more preferably 15% to 40% in gas pressure ratio; or when producing a film containing chromium and carbon by adding methane to the sputtering gas, the preferable amount of methane to be added is 6% to 40%, more preferably 7% to 30% in gas pressure ratio; or when producing a film containing chromium, nitrogen, and carbon by adding nitrogen and methane to the sputtering gas, the preferable amount of nitrogen to be added is 1% to 30%, and the preferable amount of methane to be added is 1% to 40% in gas pressure ratio.

There are no particular restrictions on the rest of the manufacturing process for the X-ray mask blanks; a conventional, well-known manufacturing process for X-ray mask blanks may be applied.

The manufacturing method for the X-ray mask in accordance with the invention will now be explained.

The manufacturing method for the X-ray mask in accordance with the invention is characterized in that it manufactures the X-ray mask by employing the X-ray mask blank in accordance with the invention set forth above.

There are no particular restrictions on the rest of the manufacturing process of the X-ray masks; a conventional, well-known manufacturing process for X-ray masks can be applied.

For instance, the patterning of the etching mask layer is performed using a well-known patterning technique employing resist (photo resist, electron beam) such as lithography (mainly including the steps of applying resist, exposure, development, etching, removing the resist, and cleaning), a multilayer resist process, and a multilayer mask (metal film/resist film, etc.) process. A better result is obtained by using a thinner resist; the resist is 50 to 1000 nm thick, and preferably 100 to 300 nm.

It is preferable to use a mixed gas of chlorine and oxygen as the etching gas for dry-etching the etching mask layer and the etching stopper layer.

The use of the mixed gas in which oxygen has been added to chlorine serving as the etching gas makes it possible to greatly slow down the etching speed, i.e. the etching rate, for the material containing Ta as the chief ingredient thereof. This in turn makes it possible to increase the etching selective ratio of the material containing Cr and carbon, and/or nitrogen to the material primarily composed of Ta (Cr/Ta), enabling the relative etching speed to be reversed (1 or more) as compared with a case wherein the etching gas is composed of chlorine alone (the etching selective ratio is 0.1).

Apparatuses that may be used for the dry etching include a plasma etching apparatus, an optical etching apparatus, a reactive ion etching (RIE) apparatus, a reactive ion beam etching (RIBE) apparatus, a sputter etching apparatus, and an ion beam etching (IBE) apparatus.

DESCRIPTION OF THE PREFERRED EMBODIMENTS

Figure 1:
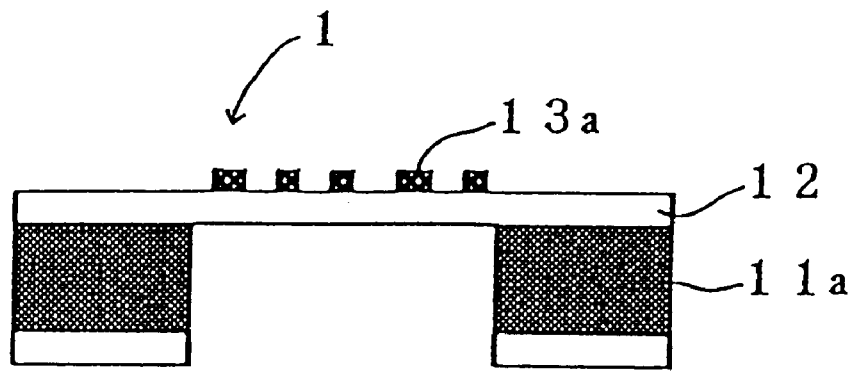
FIG. 1 is cross-sectional view illustrating the structure of an X-ray mask.
Figure 2:
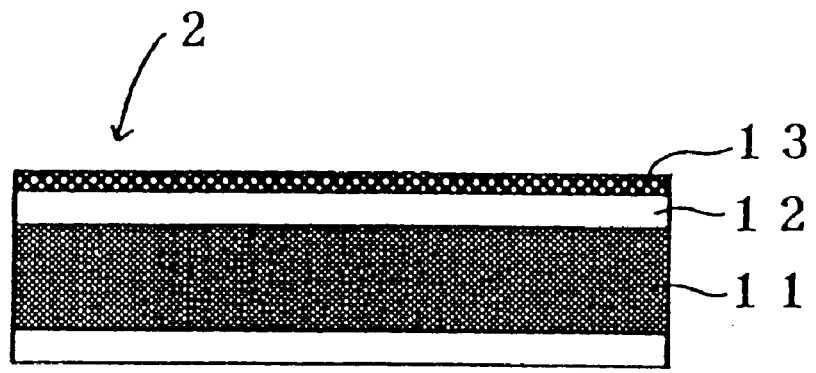
FIG. 2 is a diagram illustrating an X-ray mask blank.
Figure 3:
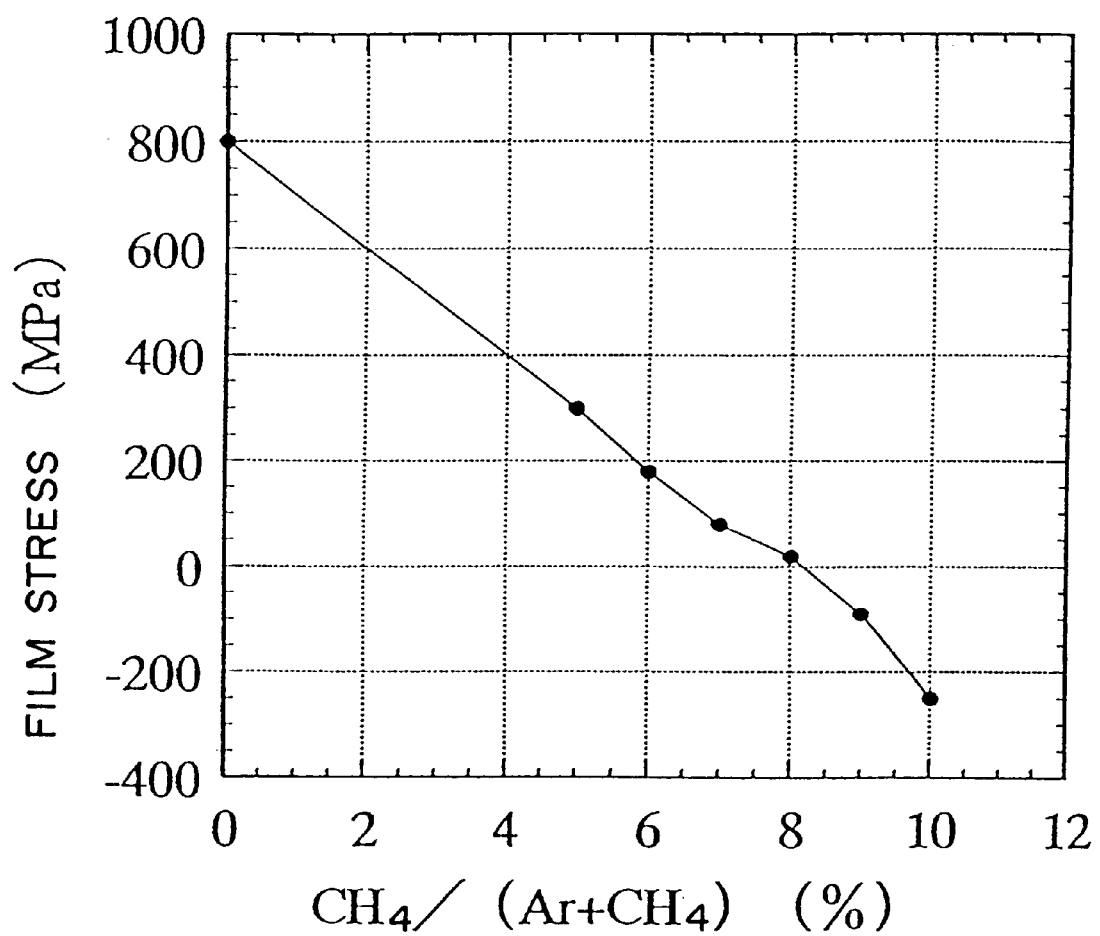
FIG. 3 illustrates the relationship between the mixing ratio of a sputtering gas and film stress.

The present invention will now be explained in more detail in conjunction with embodiments.

1st through 3rd Embodiments and 1st Comparative Example Forming Low-Stress Film

With the metal chromium used as the sputtering target, and a mixed gas of argon and methane (a total pressure: approximately 1.2 Pa) used as the sputtering gas, a film containing chromium and carbon was formed as the etching mask layer to a thickness of 500 angstroms (50 nm) by RF magnetron sputtering. Table 1 below shows different mixing ratios of argon and methane and the corresponding film stress, the etching selective ratio relative to $Ta_4B$ absorber film, the roughness of surface, and resistance to chemicals such as sulfuric acid and hydrogen peroxide (1st through 3rd embodiments). As a comparative example (1st comparative example), a metal chromium film was formed by sputtering under the same conditions as those mentioned above except that the sputter gas was composed of only argon without methane; the characteristics of the film including the film stress are also shown in Table 1.

TABLE 1

|  | Composition of Gas (Gas Pressure Ratio) | Film Stress (MPa) | Selective Ratio (Ta$_4$B/Cr) | Roughness of Surface Ra (nm) | Dissolution Rate (nm/min) | |
|---|---|---|---|---|---|---|
|  |  |  |  |  | Sulfuric Acid | Hydrogen Peroxide |
| Embodiment 1 | Ar:CH$_4$ = 93:7 | 80 | 45 | 0.6 | 0.1< | 0.1< |
| Embodiment 2 | Ar:CH$_4$ = 92:8 | 20 | 45 | 0.5 | 0.1< | 0.1< |
| Embodiment 3 | Ar:CH$_4$ = 91:9 | −90 | 45 | 0.5 | 0.1< | 0.1< |
| Embodiment 4 | Ar:N$_2$ = 60:40 | 50 | 25 | 0.4 | 0.1< | 0.1< |
| Embodiment 5 | Ar:CH$_4$:N2 = 87:8:5 | −30 | 30 | 0.4 | 0.1< | 0.1< |
| Comp. Ex. 1 | Ar:CH$_4$ = 100:0 | 1700 | 35 | 1.3 | 10 | 1.3 |

As it is obvious from Table 1, the film stress of the film containing chromium and carbon in the first through third embodiments is extremely lower than that of the metal chromium film in the first comparative example. Further, it can be seen that the film stress can be controlled by adjusting the mixing ratio of argon and methane. The film stress can also be controlled by the total pressure of the sputter gas or RF power. It has been verified that the film containing chromium and carbon in the first through third embodiments exhibits the same etching selective ratio as that of the conventional metal chromium film with respect to various types of X-ray absorber film materials. Furthermore, it can be understood that the film containing chromium and carbon in the first through third embodiments is superior to the metal chromium film in the first comparative example in the roughness of surface and resistance to chemicals such as sulfuric acid and hydrogen peroxide. To evaluate the resistance to chemicals, the films were respectively immersed for one hour in sulfuric acid and hydrogen peroxide ($H_2SO_4$:$H_2O_2$=4:1) which have been heated to 100 degrees Celsius; "0.1<" means "0.1 or less"). To evaluate the roughness of surface, an atomic force microscope (AFM) was used.

Fourth Embodiment

With the metal chromium used as the sputtering target, and a mixed gas of argon and nitrogen used as the sputtering gas, a film containing chromium and nitrogen was formed as the etching mask layer by RF magnetron sputtering. In this embodiment, the film stress was controlled by adjusting the mixing ratio of argon and nitrogen, the total pressure of the sputtering gas, and the RF power.

As shown in Table 1, the film of the fourth embodiment also exhibited low stress, high etching selective ratio, and good surface smoothness and resistance to chemicals, namely, sulfuric acid and hydrogen peroxide as in the case of the first embodiment.

Fifth Embodiment

With the metal chromium used as the sputtering target, and a gas containing argon and nitrogen used as the sputtering gas, a film containing chromium, carbon, and nitrogen was formed as the etching mask layer by RF magnetron sputtering. In this embodiment, the film stress was controlled by adjusting the mixing ratio of argon, methane, and nitrogen, the total pressure of the sputtering gas, and the RF power.

As shown in Table 1, the film of the fifth embodiment also exhibited low stress, high etching selective ratio, and good surface smoothness and resistance to chemicals, namely, sulfuric acid and hydrogen peroxide, as in the case of the first embodiment.

Sixth Embodiment

Figure 4A:
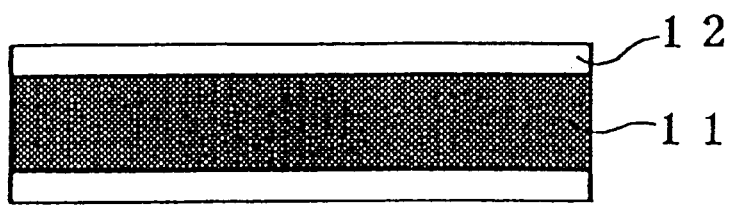
FIG. 4A through FIG. 4C illustrate the manufacturing process of an X-ray mask blank according to an embodiment of the present invention.
Figure 4B:
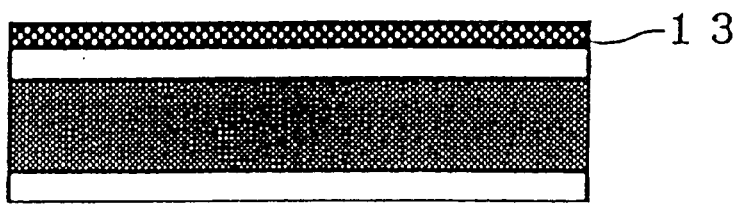
Figure 4C:
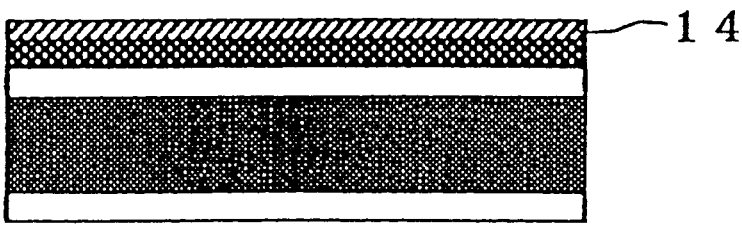

FIG. 4A through FIG. 4C show the manufacturing process for an X-ray mask blank according to an embodiment of the present invention.

As shown in FIG. 4A, silicon carbide films were formed as X-ray transparent films 12 on both surfaces of a silicon substrate 11.

As the silicon substrate 11, a silicon substrate measuring 3 inches in diameter and 2 mm in thickness and having a crystal orientation of (100) was used. The silicon carbide films serving as the X-ray transparent films 12 were formed to a thickness of 2 μm by CVD using dichlorosilane and acetylene. The film surfaces were smoothed by mechanical polishing until the surface roughness reached Ra=1 nm or less.

Then, as shown in FIG. 4B, an X-ray absorber film 13 composed of tantalum and boron was formed on the X-ray transparent film 12 to a thickness of 0.5 μm by RF magnetron sputtering process.

As the sputtering target, a sintered compact which contains tantalum and boron at an atomicity ratio (Ta/B) of 8/2 was used. The sputtering conditions were set such that argon was used as the sputtering gas, the RF power density was 6.5 W/cm$^2$ and the sputtering gas pressure was 1.0 Pa.

Then, the substrate described above was annealed for two hours at 250 degrees Celsius to produce the low-stress X-ray absorber film 13 which has a stress of 10 MPa or less.

In the next step, as shown in FIG. 4C, a film containing chromium and carbon was formed as an etching mask layer 14 on the X-ray absorber film 13 to a thickness of 0.05 μm by the RF magnetron sputtering method. As a result, the low-stress etching mask layer 14 of 100 MPa or less was obtained.

As the sputtering target, Cr was employed, and a gas composed of Ar to which 7% of methane had been added was used as the sputtering gas. The sputtering conditions were set such that the RF power density was 6.5 W/cm$^2$, the sputtering gas pressure was 1.2 Pa.

Manufacture of X-ray Mask

An X-ray mask was manufacturing by employing the X-ray mask blank obtained as set forth above.

More specifically, a line and space (hereinafter referred to as "L&S") pattern of 0.25-μm design value was drawn by electron beams on an electron beam resist applied to the X-ray mask blank and an electron beam resist pattern was formed by dry development process.

Using the electron beam resist pattern as the mask, the etching mask layer was etched by employing an electron cyclotron resonance (ECR) etching apparatus and a mixed gas of chlorineandoxygen (chlorine: 25 sccm; oxygen: 5 sccm) under an etching condition of 600 W microwave, 13 A coil current, and 120 mW/cm$^2$ RF power, while cooling the substrate to 2.5 degrees Celsius. Thus, an etching mask pattern was obtained.

Using this etching mask pattern as the mask, the X-ray absorber layer was etched by employing an ECR dry etching apparatus and a chlorine gas (25 sccm) under an etching condition of 600 W microwave, 13 A coil current, and 120 mW/cm$^2$ RF power, while cooling the substrate to 2.5 degrees Celsius, then the etching mask pattern was removed, and an X-ray absorber pattern was formed so as to obtain the X-ray mask.

Evaluation

The configuration of the section of the X-ray mask pattern obtained above was observed under a scanning electron microscope (hereinafter referred to as "SEM), and it was verified that the X-ray absorber pattern of 0.18 μm L&S has a perpendicular sidewall and exhibits extremely good characteristics (the perpendicularity and the surface condition of the sidewall, the linearity of line, etc.).

Further, the positional distortion of the X-ray mask obtained above was measured using a coordinate measuring device. The measurement result showed that the positional distortion was 22 nm or less which is required of the X-ray masks for 1-Gbit DRAMs, thus verifying that higher positional accuracy can be attained.

Seventh Embodiment

The manufacturing process used for the X-ray mask blanks according to the seventh embodiment is the same as that of the sixth embodiment; hence, the seventh embodiment will be explained with reference to FIG. 4A through FIG. 4C.

As shown in FIG. 4A, silicon carbide films were formed as X-ray transparent films 12 on both surfaces of the silicon substrate 11.

As the silicon substrate 11, a silicon substrate measuring 3 inches in diameter and 2 mm in thickness and having a crystal orientation of (100) was used. The silicon carbide films serving as the X-ray transparent films 12 were formed to a thickness of 2 μm by CVD using dichlorosilane and acetylene. The film surfaces were smoothed by mechanical polishing until the surface roughness reached Ra=1 nm or less.

Then, as shown in FIG. 4B, the X-ray absorber film 13 composed of tantalum and boron was formed on the X-ray transparent film 12 to a thickness of 0.5 μm by RF magnetron sputtering process.

As the sputtering target, a sintered compact which contains tantalum and boron at an atomicity ratio (Ta/B) of 8/2 was used. The sputtering conditions were set such that argon was used as the sputtering gas, the RF power density was 6.5 W/cm$^2$ and the sputtering gas pressure was 1.0 Pa.

Then, the substrate described above was annealed for two hours at 250 degrees Celsius to produce the low-stress X-ray absorber film 13 which has a stress of 10 MPa or less.

In the next step, as shown in FIG. 4C, a film containing chromium and nitrogen was formed as the etching mask layer 14 on the X-ray absorber film 13 to a thickness of 0.05 μm by the RF magnetron sputtering method. As a result, the low-stress etching mask layer 14 of 100 MPa or less was obtained.

As the sputtering target, Cr was employed, and a gas composed of Ar to which 35% of nitrogen had been added was used as the sputtering gas. The sputtering conditions were set such that the RF power density was 6.5 W/cm$^2$ and the sputtering gas pressure was 0.6 Pa.

Manufacture of X-ray Mask

An X-ray mask was manufactured in the same manner as in the sixth embodiment by using the X-ray mask blank obtained above.

Evaluation

The configuration of the section of the X-ray mask pattern obtained above was observed under an SEM, and it was verified that the X-ray absorber pattern of 0.18 μm L&S had a perpendicular sidewall and exhibited extremely good characteristics (the perpendicularity and the surface condition of the sidewall, the linearity of line, etc.).

Further, the positional distortion of the X-ray mask obtained above was measured using a coordinate measuring device. The measurement results showed that the positional distortion was 22 nm or less which is required of the X-ray masks for 1-Gbit DRAMs, thus verifying that higher positional accuracy can be attained.

Eighth Embodiment

The manufacturing process used for the X-ray mask blanks according to the eighth embodiment is the same as that of the sixth embodiment; hence, the eighth embodiment will be explained with reference to FIG. 4A through FIG. 4C.

As shown in FIG. 4A, silicon carbide films were formed as X-ray transparent films 12 on both surfaces of the silicon substrate 11.

As the silicon substrate 11, a silicon substrate measuring 3 inches in diameter and 2 mm in thickness and having a crystal orientation of (100) was used. The silicon carbide films serving as the X-ray transparent films 12 were formed to a thickness of 2 μm by CVD using dichlorosilane and acetylene. The film surfaces were smoothed by mechanical polishing until the surface roughness reached Ra=1 nm or less.

Then, as shown in FIG. 4B, the X-ray absorber film 13 composed of tantalum and boron was formed on the X-ray transparent film 12 to a thickness of 0.5 μm by RF magnetron sputtering process.

As the sputtering target, a sintered compact which contains tantalum and boron at an atomicity ratio (Ta/B) of 8/2 was used. The sputtering conditions were set such that argon was used as the sputtering gas, the RF power density was 6.5 W/cm$^2$ and the sputtering gas pressure was 1.0 Pa.

Then, the substrate described above was annealed for two hours at 250 degrees Celsius to produce the low-stress X-ray absorber film 13 which has a stress of 10 MPa or less.

In the next step, as shown in FIG. 4C, a film containing chromium, carbon, and nitrogen was formed as the etching mask layer 14 on the X-ray absorber film 13 to a thickness of 0.05 μm by the RF magnetron sputtering method. As a result, the low-stress etching mask layer 14 of 100 MPa or less was obtained.

As the sputtering target, Cr was employed, and a gas composed of Ar to which 5% of methane and 30% of nitrogen had been added was used as the sputtering gas. The sputtering conditions were set such that the RF power density was 6.5 W/cm$^2$ and the sputtering gas pressure was 0.6 Pa.

Manufacture of X-ray Mask

An X-ray mask was manufactured in the same manner as in the sixth embodiment by using the X-ray mask blank obtained above.

Evaluation

The configuration of the section of the X-ray mask pattern obtained above was observed under an SEM, and it was verified that the X-ray absorber pattern of 0.18 μm L&S has a perpendicular sidewall and exhibits extremely good characteristics (the perpendicularity and the surface condition of the sidewall, the linearity of line, etc.).

Further, the positional distortion of the X-ray mask obtained above was measured using a coordinate measuring device. The measurement results showed that the positional distortion was 22 nm or less which is required of the X-ray masks for 1-Gbit DRAMs, thus verifying that higher positional accuracy can be attained.

Ninth Embodiment

FIG. 5A through FIG. 5D show the manufacturing process for the X-ray mask blanks in accordance with the ninth embodiment of the present invention.

Figure 5A:
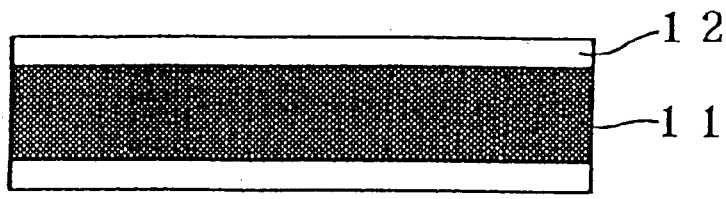
FIG. 5A through FIG. 5D illustrate the manufacturing process of the X-ray mask blank according to another embodiment of the present invention.

First, as shown in FIG. 5A, silicon carbide films were formed as X-ray transparent films (X-ray mask membranes) 12 on both surfaces of the silicon substrate 11.

As the silicon substrate 11, a silicon substrate measuring 3 inches in diameter and 2 mm in thickness and having a crystal orientation of (100) was used. The silicon carbide films serving as the X-ray transparent films 12 were formed to a thickness of 2 $\mu$m by CVD using dichlorosilane and acetylene. The film surfaces were smoothed by mechanical polishing until the surface roughness reached Ra=1 nm or less.

Figure 5B:
Figure 5B:
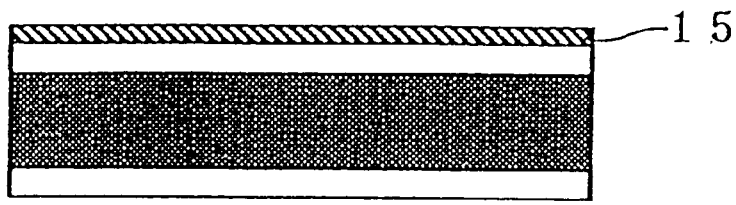

Then, as shown in FIG. 5B, a film containing chromium and carbon was formed as an etching stopper layer 15 on the X-ray transparent film 12 to a thickness of 0.02 $\mu$m by RF agnetron sputtering process. As a result, the low-stress etching stopper layer 15 having a stress of 100 MPa or less as obtained.

As the sputtering target, Cr was used; a gas composed of Ar to which 8% of methane had been added was used as the sputtering gas. The sputtering conditions were set such that a the RF power density was 6.5 W/cm$^2$ and the sputter gas pressure was 1.2 Pa.

Figure 5C:
Figure 5C:
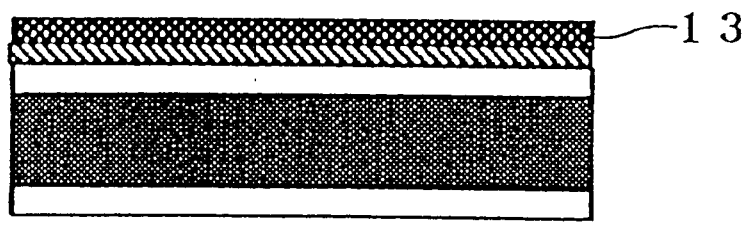

Then, as shown in FIG. 5C, the X-ray absorber film 13 composed of tantalum and boron was formed on the etching stopper layer 15 to a thickness of 0.5 $\mu$m by RF magnetron sputtering process.

As the sputtering target, a sintered compact which contains tantalum and boron at an atomicity ratio (Ta/B) of 8/2 was used. The sputtering conditions were set such that argon was used as the sputtering gas, the RF power density was 6.5 W/cm$^2$ and the sputtering gas pressure was 1.0 Pa.

Then, the substrate described above was annealed for two hours at 250 degrees Celsius to produce the low-stress X-ray absorber film 13 which has a stress of 10 MPa or less.

Figure 5D:
Figure 5D:
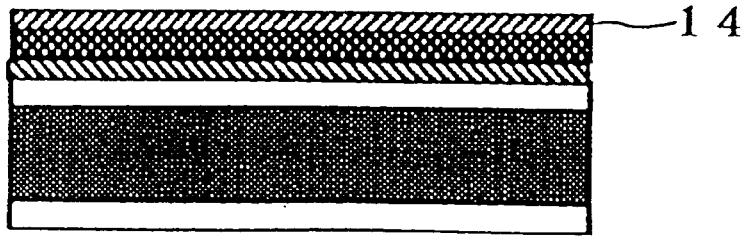

In the next step, as shown in FIG. 5D, a film containing chromium and carbon was formed as the etching mask layer 14 on the X-ray absorber film 13 to a thickness of 0.05 $\mu$m by the RF magnetron sputtering method. As a result, the low-stress etching mask layer 14 of 100 MPa or less was obtained.

As the sputtering target, Cr was employed, and a gas composed of Ar to which 10% of methane had been added was used as the sputtering gas. The sputtering conditions were set such that the RF power density was 6.5 W/cm$^2$ and the sputtering gas pressure was 0.6 Pa.

An X-ray mask was manufactured by using the X-ray mask blank obtained above, and the positional distortion of the X-ray mask obtained above was measured using a coordinate measuring device. The measurement results showed that the positional distortion was 22 nm or less which is required of the X-ray masks for 1-Gbit DRAMs, thus verifying that higher positional accuracy can be attained.

The configuration of the section of the X-ray mask pattern obtained above was observed under an SEM, and it was verified that the X-ray absorber pattern of 0.18 $\mu$m L&S has a perpendicular sidewall and exhibits extremely good characteristics (the perpendicularity and the surface condition of the sidewall, the linearity of line, etc.).

Further, it was also checked whether the X-ray transparent film had become thinner after removing the etching stopper layer. No reduction in thickness has been observed in the X-ray transparent film.

The present invention has been explained by referring to the preferred embodiments; however, the present invention is not limited to the embodiments which have been explained above.

For instance, the same advantages can be obtained by using the DC magnetron sputtering process instead of the RF magnetron sputtering process in order to form the etching mask layer and the etching stopper layer.

Likewise, the same advantages can be implemented by using an inert gas such as xenon, krypton, helium, and neon in place of the argon gas, and a hydrocarbon-based gas such as ethane and propane in place of methane.

Further, the adding concentrations of methane or nitrogen are not limited to the values in the embodiments; they are to be changed as necessary according to the sputtering apparatus used, the sputtering gas pressure, power, etc.

Furthermore, the material for the etching mask layer may contain oxygen in addition to chromium and nitrogen.

In order to control the stress of the etching mask layer more accurately, the etching mask layer or the etching mask pattern may be annealed at a temperature of 200 to 250 degrees Celsius.

For the X-ray absorber film, other material such as tantalum boride which has a composition other than Ta$_4$B, metal Ta, or an amorphous material containing Ta may be used.

As the X-ray transparent film, silicon nitride, diamond film, or the like may be used instead of silicon carbine.

Thus, according to the present invention, using the materials containing chromium and carbon, and/or nitrogen for the etching mask layer and the etching stopper layer enables an extremely low film stress to be achieved while maintaining a high etching selective ratio at the same time. This makes it possible to obtain an X-ray mask which has less positional distortion attributable to film stress, thus providing extremely high positional accuracy.

Further, using the X-ray mask blank which has the etching mask layer and the etching stopper layer composed of such a material in manufacturing an X-ray mask makes it possible to produce an X-ray mask with an X-ray absorber film pattern which has a perpendicular sidewall and which is sharp.

What is claimed is:

1. An X-ray mask blank comprising:
   (a) a mask substrate;
   (b) an X-ray transparent film which is formed on said mask substrate and through which X-rays are transmitted;
   (c) an X-ray absorber film which is formed on said X-ray transparent film and which absorbs X-rays; and
   (d) an etching mask layer which is formed on said X-ray absorber film and which is composed of a material containing chromium and carbon and/or nitrogen.

2. An X-ray mask blank comprising:
   (a) a mask substrate;
   (b) an X-ray transparent film which is formed on said mask substrate and through which X-rays are transmitted;
   (c) an X-ray absorber film which is formed on said X-ray transparent film and which absorbs X-rays; and
   (d) an etching mask layer which is formed on said X-ray absorber film and which is composed of a film containing chromium as the chief ingredient thereof and having an amorphous structure and/or a microcrystal structure.

3. An X-ray mask blank according to claim 1, wherein surface roughness Ra of said etching mask layer is 1.0 nm or less.

4. An X-ray mask blank according to of claim 1, wherein said X-ray transparent film is composed of silicon carbide.

5. An X-ray mask blank according to claim 1, wherein said X-ray absorber film is composed of a material containing Ta as the chief ingredient thereof.

6. An X-ray mask blank according to claim 5, wherein said X-ray absorber film is composed of a material containing Ta as the chief ingredient thereof and at least B.

7. An X-ray mask blank according to claim 5, wherein said X-ray absorber film is a film of an amorphous structure having Ta as the chief ingredient thereof.

8. An X-ray mask blank according to claim 1, wherein an etching stopper layer composed of a material containing chromium and carbon, and/or nitrogen is provided beneath said X-ray absorber film.

9. A manufacturing method for an X-ray mask blank, said manufacturing method comprising the steps of:

(a) forming an X-ray transparent film on a mask substrate;

(b) forming an X-ray absorber film on said X-ray transparent film; and (c) forming an etching mask layer composed of a material containing chromium and carbon, and/or nitrogen on said X-ray absorber film;

wherein said etching mask layer is formed by using a chromium target and adding a gas containing carbon and/or a gas containing nitrogen to a sputtering gas in the step for forming said etching mask layer.

10. A method for manufacturing an X-ray mask by applying an X-ray mask blank set forth in claim 1, said method comprising the steps of:

(a) preparing a mask substrate coated with an X-ray transparent film, an X-ray absorber film and an etching mask layer repectively thereon;

(b) etching said etching mask layer so as to define a desired pattern by using said X-ray blank as a mask;

(c) etching said X-ray absorber film by using said pattern of said etching mask layer as a mask; and (d) removing said etching mask layer.

* * * * *